US007858901B2

(12) United States Patent
Krishnan et al.

(10) Patent No.: US 7,858,901 B2
(45) Date of Patent: Dec. 28, 2010

(54) FOCUSING AN OPTICAL BEAM TO TWO FOCI (75) Inventors: Venkatakrishnan Krishnan, Donabate (IE); Tan Bo, Donabate (IE)

(73) Assignee: Electro Scientific Industries, Inc., Portland, OR (US)

( * ) Notice: Subject to any disclaimer, the term of this patent is extended or adjusted under 35 U.S.C. 154(b) by 1251 days.

(21) Appl. No.: 10/559,026

(22) PCT Filed: May 27, 2004

(86) PCT No.: PCT/EP2004/005738

§ 371 (c)(1),
(2), (4) Date: May 24, 2006

(87) PCT Pub. No.: WO2004/105995

PCT Pub. Date: Dec. 9, 2004

(65) Prior Publication Data
US 2006/0261050 A1 Nov. 23, 2006

(30) Foreign Application Priority Data
May 30, 2003 (GB) .................................. 0312469.0

(51) Int. Cl.
B23K 26/067 (2006.01)
B23K 26/36 (2006.01)
H01L 21/82 (2006.01)
(52) U.S. Cl. ............................. 219/121.68; 219/121.69; 219/121.77; 438/463
(58) Field of Classification Search ............ 219/121.61, 219/121.63–121.72, 121.76, 121.77, 121.85; 250/492.1, 503.1; 356/450, 491
See application file for complete search history.

(56) References Cited
U.S. PATENT DOCUMENTS

| 3,710,798 | A | * | 1/1973 | Bredemeier | 606/11 |
| 4,644,160 | A | | 2/1987 | Hitachi | |
| 4,701,005 | A | * | 10/1987 | Noguchi | 359/17 |
| 4,780,616 | A | * | 10/1988 | Nishi et al. | 250/548 |
| 5,251,198 | A | * | 10/1993 | Strickler | 369/94 |
| 5,349,592 | A | * | 9/1994 | Ando | 372/32 |
| 5,383,024 | A | * | 1/1995 | Maxey et al. | 356/336 |
| 5,508,992 | A | * | 4/1996 | Hirose et al. | 369/112.08 |
| 5,671,207 | A | * | 9/1997 | Park | 369/44.23 |
| 5,696,750 | A | * | 12/1997 | Katayama | 369/112.06 |
| 5,728,993 | A | * | 3/1998 | O'Neill | 219/121.67 |
| 6,175,096 | B1 | | 1/2001 | Nielsen | |
| 6,208,473 | B1 | * | 3/2001 | Omura | 359/727 |

(Continued)

FOREIGN PATENT DOCUMENTS

EP 0706072 4/1996

(Continued)

Primary Examiner—Samuel M Heinrich (57) ABSTRACT

A Plate polarising beam splitter 22 splits an incident laser beam 21 to form a first laser beam 24 and a second laser beam 25. The first laser beam is optically modified using an arcuate reflector 23 so that the first laser beam has a different divergence or convergence from that of the second laser beam. The first laser beam 24 is focussed at a first focus 27 on an optical axis of a focussing lens 26 and the second laser beam is focussed at a second focus 28 on the optical axis for machining a workpiece. The apparatus is suitable for machining with the laser beams steered by a galvanometer scanner.

43 Claims, 5 Drawing Sheets

U.S. PATENT DOCUMENTS

| | | | |
|---|---|---|---|
| 6,875,951 B2 * | 4/2005 | Sakamoto et al. | 219/121.73 |
| 6,972,906 B2 * | 12/2005 | Hasman et al. | 359/569 |
| RE38,943 E * | 1/2006 | Komma et al. | 359/19 |
| 6,984,802 B2 * | 1/2006 | Kuroiwa et al. | 219/121.73 |
| 2001/0019044 A1 | 9/2001 | Bertez | |
| 2002/0115235 A1 | 8/2002 | Sawada | |
| 2003/0006221 A1 | 1/2003 | Ming et al. | |
| 2005/0067393 A1 * | 3/2005 | Olivier | 219/121.75 |

FOREIGN PATENT DOCUMENTS

| | | |
|---|---|---|
| EP | 0757932 | 2/1997 |
| GB | 1553582 | 10/1979 |
| JP | 010143783 | 6/1989 |
| JP | 070080672 | 3/1995 |
| JP | 090043537 | 2/1997 |
| JP | 2001321978 | 11/2001 |
| WO | 2003/018246 | 3/2003 |

* cited by examiner

Figure 1

PRIOR ART

Cross section after first cut

Fig. 5(a)

Cross section after multiple cuts along the some dicing line

Fig. 5(b)

Cross section of the dicing lane

First layer removed after first cycle
Second layer removed after second cycle
Third layer removed after third cycle
...
Last layer removed after $n^{th}$ cycle

FOCUSING AN OPTICAL BEAM TO TWO FOCI

The present invention relates to an apparatus and method for focusing an optical beam to two foci. The invention has particular application in, but is not limited to, laser machining and more particularly in laser dicing of silicon wafers.

Laser machining using two focal points from a single laser source is known for machining thick metallic sheets. Two focal points are generated from a single laser source using a dual-focus lens invented at the FORCE Institute. (Denmark). A laser beam is focused by a lens having a central portion with a focal length that is longer than a focal length of remaining portions of the lens. Such dual focus lens systems are disclosed in, for example, WO 03/018246 and U.S. Pat. No. 6,175,096 for machining thick metallic sheets. The dual-focus lens improves machining throughput and quality but is limited by a short lifetime and high cost of the lens. More importantly, particularly for silicon wafer dicing, the main drawback of this technique is that the known dual focus lenses are not telecentric so that the laser beam cannot be scanned across a workpiece being machined using a galvanometer mirror but only using a translation table, because during scanning a uniform beam focus would not be obtained across a square area of field of view of the lens. This imposes a serious throughput limitation on the current dual-focus technique for semiconductor wafer dicing. Moreover, the dual focus lens does not provide a micron-range separation between the two foci required for semiconductor wafer dicing. EP 0706072 discloses a system in which advantageous manufacturing and maintenance costs are claimed by separating a single focus lens from a beam splitting and differential convergence component. Limited scanning of two beams with foci side-by-side on a work-piece is also disclosed. However, in at least some embodiments, EP 070672 discloses generation of multiple focal points using a mirror with segments of different curvature. By this means the single is beam is divided into fragments of beam of different divergence angle. Such mirrors with segments are not standard optical components and would have to be specially manufactured. Moreover, by this means a Gaussian profile is no longer maintained and the disclosed device is only suitable for laser processing a thick work-piece of few mm thickness. There is no disclosure of beam scanning with different foci on a same optical axis one above another in a workpiece.

Silicon wafer dicing is at present an indispensable process in the manufacture of semiconductor integrated circuits. During manufacture, silicon integrated circuits or chips are normally separated from a wafer, composed of a large number of chips, using a diamond-edged saw blade. However, the application of such abrasive dicing does not meet the requirements of the semiconductor industry for greater accuracy, smaller kerf width and enhanced dicing quality. Problems of saw dicing include:

1. a lack of constant dicing quality due to blade wear;
2. high cost due to high consumption of saw-blades;
3. chipping of dies;
4. mechanical stress and crack formation in dies;
5. unsuitability for very thin wafers; and
6. inability to cut other than straight contours.

Figure 1:
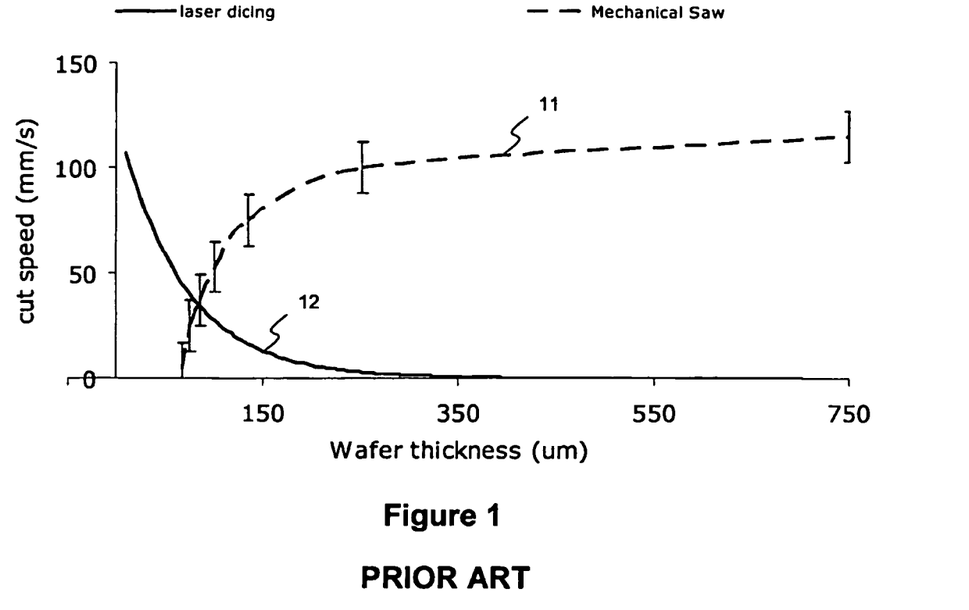
FIG. 1 is a graph of machining speed vs. wafer thickness for saw-blade dicing and laser dicing of the prior art.

The above-mentioned problems can be overcome with pulsed laser dicing. However, although laser dicing is able to compete with saw-blade dicing in terms of street width and dicing quality, laser dicing is not competitive in terms of dicing speed for wafer substrates thicker than approximately 100 µm, and therefore laser dicing is currently used to dice only thin wafers with a thickness of less than 100 µm. FIG. 1 shows graphically dicing speeds for mechanical saw dicing, plot 11, and laser dicing, plot 12, as a function of wafer thickness. The graph shows that at wafer thickness of above 100 µm, laser dicing is unable to compete with saw-blade dicing in dicing speed. The extremely slow dicing speed of laser dicing, which results in an unsatisfactory throughput, limits the applicability of laser wafer dicing. To extend laser dicing to thicker wafers, the dicing speed at wafer thicknesses of greater than 100 µm has to be increased.

It is an object of the present invention at least to ameliorate the aforesaid deficiencies in the prior art.

According to a first aspect of the present invention there is provided a laser machining apparatus comprising plate polarising beam splitter means for splitting an incident polarised laser beam to form a first laser beam and a second laser beam; optical beam modification means comprising arcuate reflecting means for providing the first laser beam with a different divergence or convergence from that of the second laser beam; focusing means for focusing the first laser beam at a first focus substantially on an optical axis of the focusing means and for focusing the second laser beam at a second focus on the optical axis, such that at least one of the first focus and the second focus is not at a focal point of the focusing means; and galvanometer means (44) for scanning the first laser beam (24) and the second laser beam (25) across a workpiece (45) to machine the workpiece.

Advantageously, the arcuate reflecting means comprises a convex mirror.

Preferably, a distance between the first focus and the second focus is selectable by selecting a radius of curvature of the arcuate reflecting means.

Advantageously, a distance between the first focus and the second focus is between millimeters and tenths of microns.

Conveniently, the laser machining apparatus further comprises laser beam generating means for generating the incident laser beam.

Advantageously, the plate polarising beam splitter means comprises a polarisation dependant layer for substantially reflecting the first beam with a first polarisation component and substantially transmitting the second beam with a second polarisation component.

Conveniently, the incident polarised laser beam is substantially collimated.

Conveniently, the first laser beam is substantially collimated and the second laser beam is divergent after modification by the optical beam modification means.

Preferably, the incident polarised laser beam is pulsed.

Advantageously, the laser machining apparatus further comprises translation table means for moving the workpiece with respect to the first laser beam and the second laser beam.

Conveniently, where the first laser beam and the second laser beam interfere to form interference fringes, the apparatus further comprises imaging means and associated control means for using an image of the interference fringes to align the first and second foci on an optical axis of a scanning lens associated with the galvanometer means.

Preferably, the laser machining apparatus further comprises scanning strategy control means for controlling at least one of incident laser beam power, pulse repetition rate and galvanometer scanning speed during machining of a workpiece.

Advantageously, the laser machining apparatus further comprises gas assist means for at least one of improving machining speed, improving removal of machining debris and enhancing strength of the machined workpiece.

Advantageously, the laser machining apparatus further comprises coating means for applying a protective sacrificial coating to the surface of the workpiece prior to laser machining for protecting a surface of the workpiece from debris produced during laser machining and also facilitating removal of debris from the workpiece surface subsequent to laser machining.

Preferably, the laser machining apparatus comprises coating removal means for removal of the sacrificial coating subsequent to laser machining.

Conveniently, the laser machining apparatus is arranged for dicing silicon wafers.

Advantageously an effective focal depth of the laser beam is increased.

Conveniently, the laser machining apparatus is arranged to reduce a dicing kerf thereby increasing a maximum number of dies per wafer.

Conveniently, an effective machining focal depth of the laser beam is increased for increased aspect ratio micromachining of vias and increased throughput.

Advantageously, the laser machining apparatus is arranged for scribing wafers to remove material.

According to a second aspect of the invention, there is provided a focusing apparatus for focusing an incident polarised optical beam, the apparatus comprising optical plate polarising beam splitter means for splitting the incident optical beam to form a first optical beam and a second optical beam; optical beam modification means comprising arcuate reflecting means for providing the second optical beam with a different divergence or convergence from that of the first optical beam; and focusing means for focusing the first optical beam at a first focus on an optical axis of the focusing means and for focusing the second optical beam at a second focus on the optical axis, such that at least one of the first focus and the second focus is not at a focal point of the focusing means.

Conveniently, the arcuate reflecting means comprises a convex mirror.

Preferably, the plate polarising beam splitter means comprises a polarisation dependant layer for substantially reflecting the first optical beam with a first polarisation component and substantially transmitting the second optical beam with a second polarisation component.

According to a third aspect of the invention, there is provided a method of laser machining a workpiece comprising the steps of: splitting an incident polarised laser beam to form a first laser beam and a second laser beam using a plate polarising beam splitter; modifying at least the second laser beam to provide the second laser beam with a different divergence or convergence from that of the first laser beam using arcuate reflecting means; providing focusing means; using the focusing means to focus the first laser beam at a first focus on an optical axis of the focusing means and to focus the second laser beam at a second focus on the optical axis, such that at least one of the first focus and the second focus is not at a focal point of the focusing means; and using galvanometer means to scan the first laser beam and the second laser beam across a workpiece to machine the workpiece.

Preferably, the method comprises a further step of scanning the first laser beam and the second laser beam across the workpiece using galvanometer means.

Conveniently, the arcuate reflecting means comprises a convex mirror.

Preferably, the step of splitting the incident laser beam comprises using a polarisation dependant layer for substantially reflecting the first laser beam with a first polarisation component and substantially transmitting the second laser beam with a second polarisation component.

Preferably, the method comprises a further step of moving the workpiece with respect to the first laser beam and the second laser beam with translation table means.

Advantageously, the method comprises a further step of aligning the first and second foci on an optical axis of a scanning lens associated with the galvanometer means using imaging means and associated control means for using an image of interference fringes formed by interference of the first laser beam and the second laser beam.

Preferably, the method comprises a further step of controlling at least one of incident laser beam power, pulse repetition rate and galvanometer scanning speed during machining of a workpiece.

Preferably, the method comprises a further step of providing gas assist means for at least one of improving machining speed, improving removal of machining debris and enhancing strength of the machined workpiece.

Advantageously, the method comprises a further step of applying a protective sacrificial coating to a surface of the workpiece prior to laser machining.

Preferably, the method comprises a further step of removing the sacrificial coating subsequent to laser machining.

Advantageously, the method is arranged for dicing silicon wafers.

Conveniently, a distance between the first focus and the second focus is between millimeters and tenths of microns.

Advantageously, a distance between the first focus and second focus is selectable by selecting a radius of curvature of the arcuate reflecting means.

Conveniently, a focal depth of the laser beam is sufficient for high aspect ratio micromachining.

Advantageously, a dicing kerf is sufficiently reduced to increase a maximum number of dies per wafer.

Conveniently, the method is arranged for high aspect ratio micro-via drilling in silicon wafers.

Advantageously, the method is arranged for scribing wafers for removal of material from the wafer.

According to a fourth aspect of the invention, there is provided a method of focusing an incident polarised optical beam, comprising the steps of: splitting the incident polarised optical beam to form a first optical beam and a second optical beam using a plate polarising beam splitter; modifying at least the second optical beam for providing the second optical beam with a different divergence or convergence from that of the first optical beam using arcuate reflecting means; providing focusing means; and using the focusing means to focus the first optical beam at a first focus on an optical axis of the focusing means and to focus the second optical beam at a second focus on the optical axis such that at least one of the first focus and the second focus is not at a focal point of the focusing means.

Advantageously, the arcuate reflecting means comprises a convex mirror.

Preferably, the step of splitting the incident optical beam comprises using a polarisation dependant layer for substantially transmitting the first optical beam with a first polarisation component and substantially reflecting the second optical beam with a second polarisation component.

The invention will now be described, by way of example, with reference to the accompanying drawings in which.

In the Figures, like reference numerals denote like parts.

Figure 2:
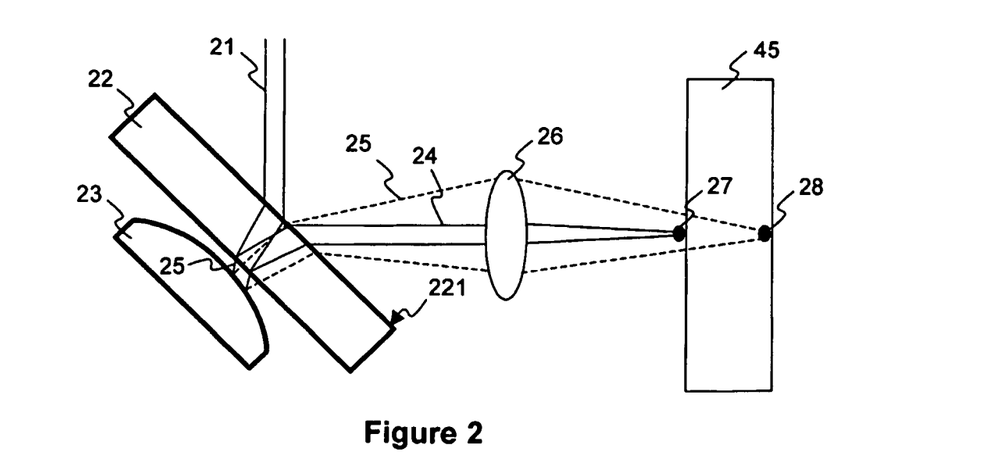
FIG. 2 is a schematic drawing of optical components for generating two foci from a single optical beam according to the present invention.
Figure 3:
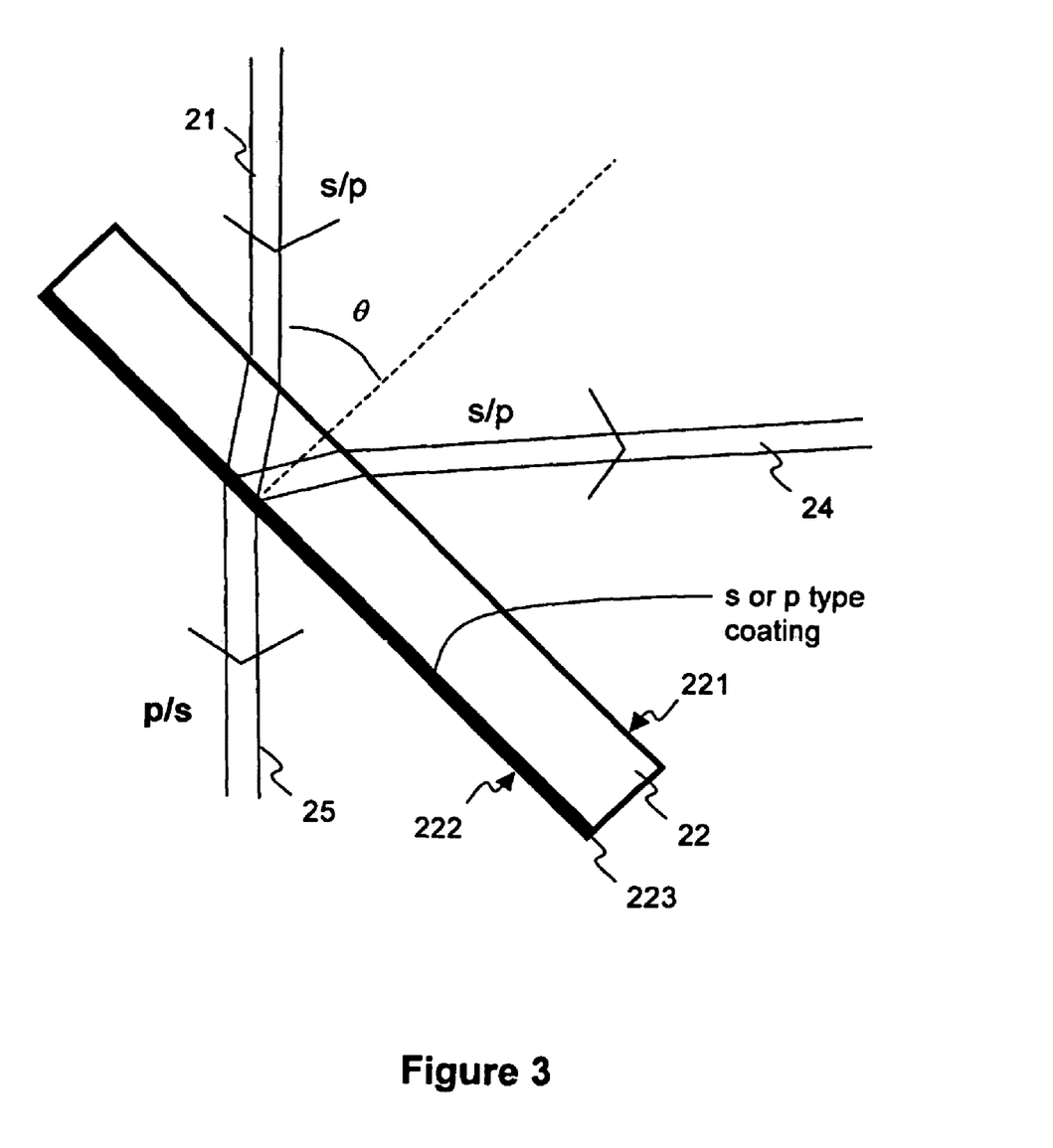
FIG. 3 is a schematic drawing of a beam splitter of the optical structure of FIG. 2.

An apparatus according to a first aspect of the invention for generating two foci from a single incident optical beam is illustrated in FIG. 2. A linearly, circularly or elliptically polarized and collimated laser beam 21 is incident at an inclined angle on a first surface 221 of a polarising plate beam splitter 22. As shown best in FIG. 3, where an elliptically polarised laser beam 21 is incident at an angle of incidence θ on the first surface 221, the plate beam splitter 22 splits the laser beam 21 into a reflected first laser beam 24 and a transmitted second laser beam 25. Preferably, the first surface 221 has an anti-reflection coating, not shown, to reduce energy loss at the first surface. The second surface 222 has an s-type polarisation coating 223 so that s-polarised light is reflected to form the reflected first laser beam 24 while p-polarised light is transmitted to form the transmitted second laser beam 25. It will be understood that the polarisations of the transmitted and reflected beams will be reversed if a p-type polarisation coating is used. Referring again to FIG. 2, the second laser beam 25, which is transmitted through the plate beam splitter 22, is incident on a convex mirror 23 with a radius of curvature of R, and is specularly reflected back through the beam splitter 22 as a divergent second laser beam. Therefore, output from the combination of plate beam splitter 22 and convex mirror 23 are two collinear laser beams 24, 25 with different angles of divergence. These two beams may interfere to form interference fringes. Since in the embodiment shown in FIG. 2, the incident laser beam 21 is collimated, the reflected first laser beam 24, which is a reflection of collimated laser beam 21, is also collimated, while the second laser beam 25 has a divergence angle of θ", where $$\theta'' = D/R, \text{ and } D \text{ is the diameter of laser beam 21.}$$

The first laser beam 24 and second laser beam 25 emergent from the plate beam splitter 22 are incident substantially normally on a scanning lens 26. The first laser beam 24 and second laser beam 25 are focused by the telecentric and/or f-Theta scanning lens 26 to a first focus 27 and a second focus 28, respectively. The first focus 27 is closer to the lens 26 than the second focus 28. A distance between the first and second foci 27, 28 is a function of the radius of curvature R of the convex mirror 23. Therefore, the distance between the foci can be changed by substituting a different mirror of different radius. A distance of a few millimeters to a few tenths of microns is found to be suitable for, for example, dicing semiconductor wafers. Although the first focus is illustrated on a first surface of the workpiece and the second focus between the first focus and an opposed second surface of the workpiece this is not always a preferred method of machining. For example, the first focus may be at a distance from the first surface. If one of the first and second laser beams is collimated then that beam will be focussed at the focal point of the scanning lens. Otherwise, neither focus will be at the focal point of the lens.

A spot size $\omega_{0\,first}$ of the first focus 27 can be written as $$\omega_{0\,first} = 2\lambda f/D' \quad (1)$$

where f is the effective focal length of the lens 26.

Although a beam splitter dependent on polarisation has been described, it will be apparent that other forms of beam splitter, not necessarily dependent on polarisation, e.g. a half-silvered mirror, may be used, although possibly with lower efficiency.

Similarly, although the use of a convex mirror has been described for changing the divergence of the second beam, any optical component, or combination of optical components, for example lenses or concave mirrors, which change the divergence or convergence of one emergent beam from the beam splitter with respect to the other emergent beam, and return both beams along a same path to a focusing lens or system, may be used.

Figure 4:
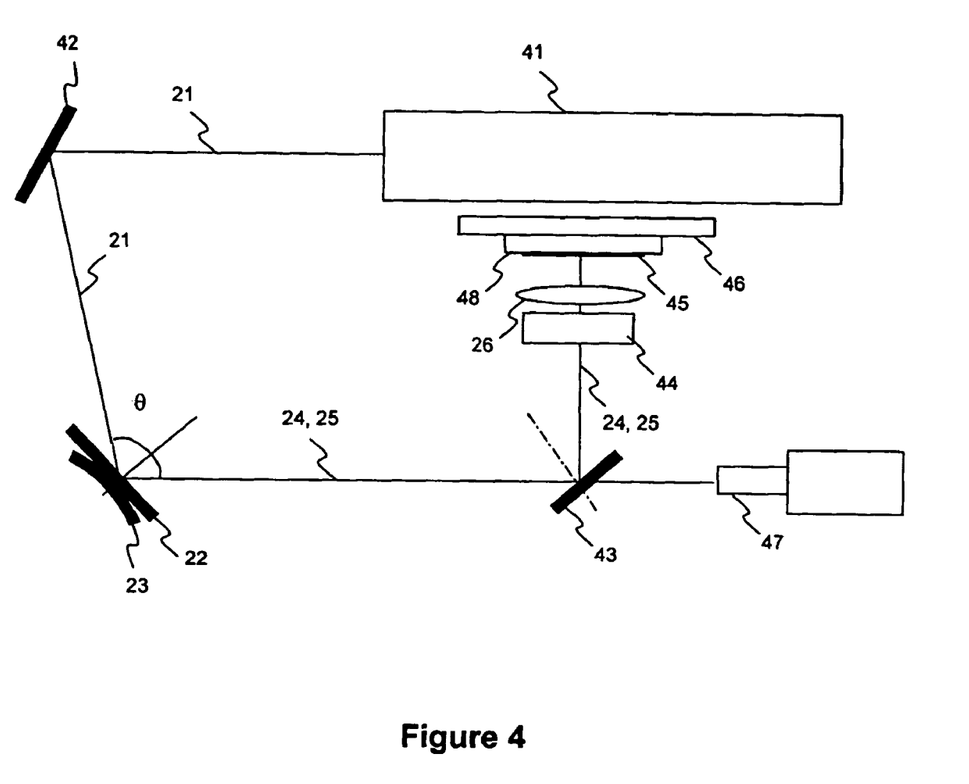
FIG. 4 is a schematic drawing of optical elements of an apparatus according to an aspect of the present invention, incorporating the optical structure of FIG. 2.

FIG. 4 depicts an overall optical system for two-foci laser ablation for silicon wafer dicing using the focusing apparatus of the first aspect of the invention, although it will be understood that the invention is equally suitable for dicing or machining other types of semiconductor, or other material, workpiece, substrate or wafer. A laser source 41 generates a pulsed laser beam 21. Typically the laser produces nanosecond, picosecond or femtosecond pulses. In one embodiment of this invention, the laser beam suitably has an average power ranging from 7 to 15 W, a repetition rate of 50~100 kHz and a pulse width in the range of a few tens of nanoseconds. The laser beam 21 emitted from the laser source 41 is linearly polarized. A waveplate may be placed before the dual focusing optical arrangement in order to convert the laser beam polarisation to elliptical or circular if required. The laser beam 21 is directed into the beam splitting optics 22, 23, illustrated in FIG. 2, by a first plane mirror 42 inclined to the laser beam 21, such that the laser beam 21 is incident on the plate beam splitter 22 at an angle of incidence θ.

First and second laser beams 24, 25 emergent from the beam splitter 22, 23, with different divergences from each other, are incident on a second inclined plane mirror 43 which reflects the first and second laser beams 24, 25 onto a pair of galvanometer mirrors 44. The galvanometer mirrors 44 are located optically upstream of the scanning lens 26 to provide high-speed beam scanning of the first and second laser beams 24, 25 onto a wafer 45 substantially normal to the first and second laser beams. The scanning lens 26 is preferably telecentric and/or f-Theta. The wafer may be, for example, of silicon, metal or non-metal. The wafer 45 is mounted on a dicing tape and tape ring 48. During dicing the laser beam cuts through the wafer while the dicing tape is uncut or only slightly cut.

The plane mirrors 42, 43 are employed merely to provide a compact laser machining system. The plane mirrors 42, 43 may be arranged in other ways, according to requirements of an application of the invention. Either or both of them may be dispensed with, according to the application. Alternatively, additional mirrors may be added to the machining system as required.

The wafer 45 is mounted on an XY translation stage 46 on which the wafer 45 is supported during a machining process and by which the wafer 45 is translated with respect to the first and second laser beams 24, 25 during dicing and after laser dicing of an area defined by a field of view of the scanning lens.

A CCD camera 47 is located on an axis of the first and second laser beam 24, 25 emergent from the beam splitter 22, 23, optically downstream of the second plane mirror 43, which is partially reflective and partially transmitting. The camera captures the image of the fringes formed by interference between first and second laser beams 24, 25. This image is used to align the first and second foci so that they both fall on the optical axis of the scanning lens 26. That is, the two laser beams and foci are aligned to the optical axis of the system by rotating the convex mirror and by viewing, with the CCD camera, light passing through the partially reflecting mirror 43. This light transmitted by the partially reflective mirror 43 forms a fringe pattern caused by interference of the first and second laser beams. When the beams are aligned a ring pattern of concentric circles is produced and when the beams are misaligned an irregular fringe pattern is produced. Misalignment of the two foci results in a drastic reduction in ablation speed.

During the dicing process, the first focus 27 is located on a top surface of the wafer 45, while the second focus 28 is located inside the bulk of wafer material and close to a bottom surface of the wafer as shown in FIG. 2.

Figure 5A:
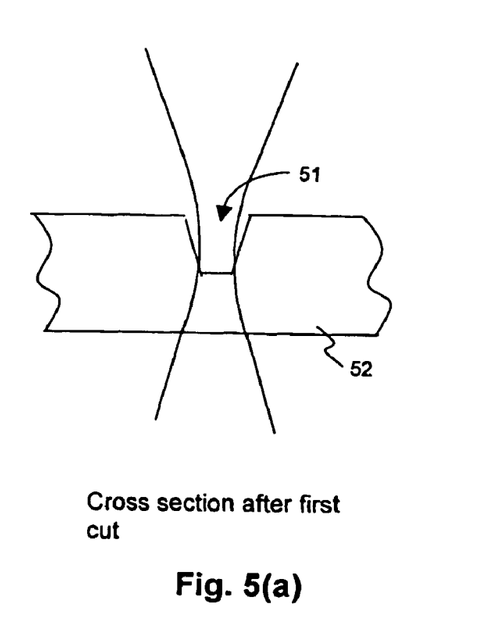
FIGS. 5(a) to 5(c) are vertical cross-sections of a dicing lane machined in a wafer illustrating a dicing strategy useful in the present invention.
Figure 5B:
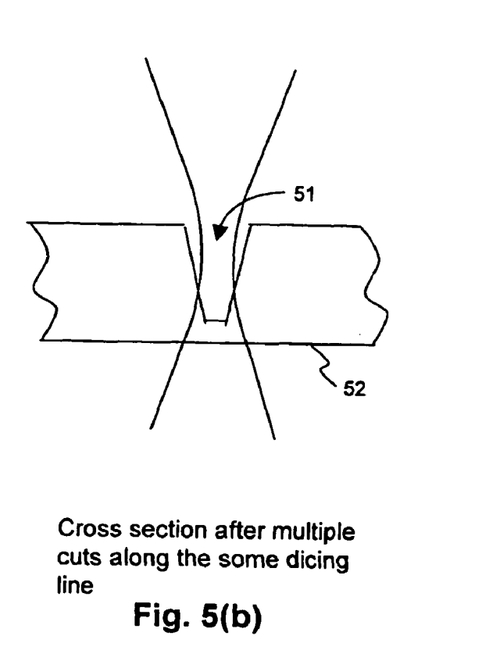
Figure 5C:
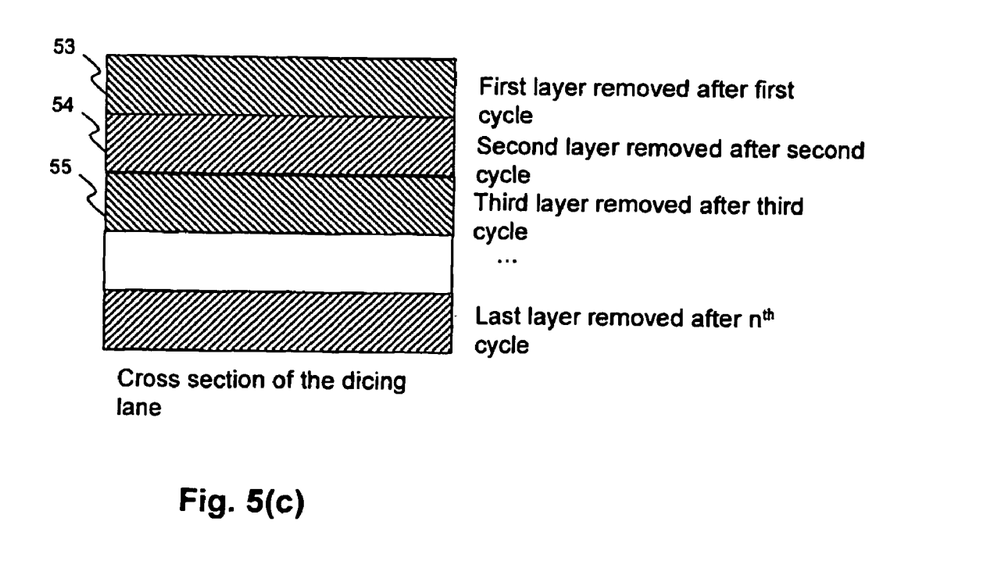
Figure 6:
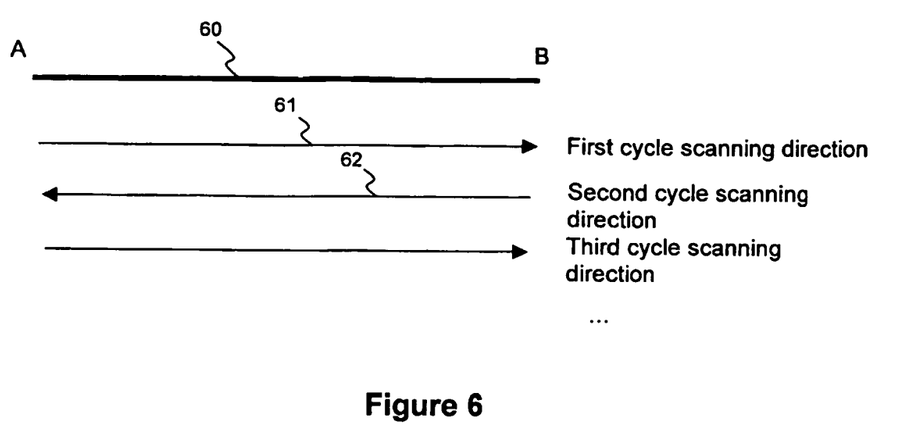
FIG. 6 is a diagram showing scanning directions in sequential scans of a dicing lane useful in the present invention.
Figure 7:
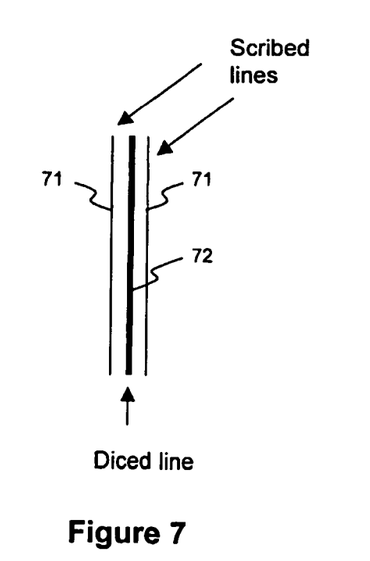
FIG. 7 is a diagram showing a scribing-dicing procedure useful in the present invention.

A cutting strategy for wafer dicing is used. To achieve a high cutting speed and acceptable quality, the laser beams 24, 25 scan a wafer along a dicing lane for multiple cycles at high speed. A suitable scanning speed ranges from a few hundred mm/sec to a few thousand mm/sec. An example of the cutting strategy is depicted in FIG. 5. At a high scanning speed, a small quantity of silicon material is removed from a dicing lane 51 in a wafer 52, forming a shallow channel along the dicing lane 51 as shown in FIG. 5(*a*). By further cutting along the dicing lane 51, further silicon is removed from the wafer 52 layer by layer, 53, 54, 55 as shown in FIGS. 5(*b*) and 5(*c*). Let n cycles of repeated scanning be required to obtain a through cut, then using a scanning speed $v_{scanning}$, a machining speed $v_{machining}$ of the dicing process is obtained from the formula:

$$L/v_{machining} = nL/v_{scanning} + (n-1)T$$

where L is a length of the dicing lane and T represents a delay time of the scanning mirror at an end of each scanning cycle. Therefore, to achieve a maximum machining speed, T must be reduced to a minimum. The scanning direction of each cycle is arranged in such a way that an end point of a previous scanning cycle is a starting point of a next cycle. As shown in FIG. 6, where A and B represent two opposed ends of a dicing lane 60, if the laser beams 24, 25 scan from A to B in a first cycle 61, the laser beams 24, 25 scan from B to A in a second cycle 62, and so on. The scanning speed and the number of cycles are optimised by experiment to achieve a highest machining speed.

Another cutting strategy for wafer dicing involves two steps. First, the laser beams 24, 25 scan a dicing lane once at low speed $v_{lowspeed}$ to cut through a bulk of a wafer. A suitable scanning speed is in the range from a few mm/sec to a few tens mm/sec depending on thickness of the wafer. At this speed, molten or vaporized material cannot escape completely from a groove machined in the dicing lane. A large quantity of molten or vaporized material is re-deposited inside the groove. To obtain a clear cut along the dicing lane, the laser beam scans for n cycles across the wafer using the dicing strategy described in the previous paragraph. The scanning speed and the number of cycles must again be optimised by experiment to achieve a highest machining speed. In this cutting strategy, the overall machining speed is determined by the following equation.

$$L/v_{machining} = L/v_{lowspeed} + nL/v_{scanning} + nT$$

Although the invention has been described principally as applied to dicing of semiconductor wafers, the invention has other applications. For example, a focal depth of the laser beam may be extended for high aspect ratio micromachining. Similarly, the invention may be used for high aspect ration micro-via drilling in, for example, silicon wafers.

In a dicing application, the use of the two foci of the invention allows a reduced width kerf to be used between die. This means that an increased number of die may be accommodated on a given size wafer.

The invention may also be used for scribing low-dielectric constant (low-K) materials.

If a wafer or workpiece to be machined includes multilayer electronic devices, such as integrated-circuit chip packages, multi-module or high-density interconnect circuit boards, a direct exposure to a high power laser beam may cause damage to layers of the multilayer workpiece, since these layers may be very thin. For example, a standard metal component layer typically has a thickness of 5 μm, a standard organic dielectric layer typically has a thickness of 30 μm. If damage would occur to a multilayer wafer diced by a high power laser beam, a process of scribing-dicing is employed to eliminate damage to layers on top of the multilayer wafer. Prior to dicing, the wafer is scribed by the laser beams 24, 25 at high speed to form scribed lines 71 both sides of a dicing lane 72, as depicted in FIG. 6. The scribing machining speed is higher than that used for dicing. At such high machining speed, thin layers on top of the silicon wafer are singulated without causing any damage to their edges. A dicing process as described above is used to separate the remaining portions of the silicon wafer beneath these thin surface layers.

It has been found that gas or air assist further improves dicing speed, reduces debris and enhances die strength. A gas, such as one of argon, SF6, CF4, HFC, helium or a chlorofluorocarbon or halocarbon gas, applied to the wafer surface therefore further increases dicing speed and dicing quality.

The workpiece may be coated with a protective sacrificial coating before machining to protect the surface from debris produced during machining. The sacrificial coating may be removed after machining to facilitate removal of such debris.

Although the invention has been described using a beam splitter with a single incident beam, it will be apparent that the same advantage may be achieved using a plurality of independent laser beams with different divergence or convergence effectively to increase the focal depth of the combined beams incident on a workpiece by producing a plurality of foci.

This invention may provide at least some of the advantages that are enumerated below.
1. An ability to cut thick substrates that are difficult to cut through using a single focus.
    A focal depth of the focused spot limits a maximum thickness a laser beam with a single focus can cut through. Introducing an additional focus is equivalent to stretching the focal depth of the machining spot, thereby increasing dicing depth.
2. Increase the ablation rate
    It is found that higher ablation efficiency can be obtained if a focus is focused deeply inside the bulk of the wafer rather than on the top surface of it. However, when a laser beam is focussed deeply into the bulk of a thick wafer, the laser energy incident on the top surface may be not sufficient to overcome an ablation threshold to begin ablation. Ablation with two foci allows one laser beam to be focused deeply into the bulk of the wafer while the other is focused on a top surface of the wafer, so that the ablation process can be started without difficulty. In this way, the ablation rate is increased. The high ablation rate of the two foci can be further explained by the high dynamics of the plumes produced by dual-laser ablation, which has been studied by Witanachchi ("High ionised carbon plasma generation by dual-laser ablation for diamond-like carbon film growth", Mat. Res. Soc. Symp. Vol. 617, J3.6.1-J3.6.6, 2000.) According to Witanachchi's study, dual-laser ablation produces two plumes, while single focus laser ablation produces one plume. Moreover, dual-laser ablation increases ionic content of the plumes by at least five times compared with that of a single focus ablated plume. The consequence of the presence of the additional plume and the higher density of ionic content in the plumes is that more material is vaporized in the same time, in another words, material is removed at a higher rate. From Witanachchi's study it is predicted that the ablation rate of double-focal-point ablation will be a few times higher than that of conventional single-focal-point ablation. It is found that ablation rate increases by a factor of a few times with double-focal-point ablation. The factor depends on thickness and material of the wafer and laser power.

3. Reduce debris.

Laser ablation is a combined effect of thermal melting and ionisation. At initiation of ablation, melting dominates the process, generating molten material emitted from a machining spot and re-deposited. Thermal energy from the laser beam increases temperature at the machining spot. When a predetermined temperature is reached, an ionisation process dominates the ablation process. When material is ionised, no big macular clusters are produced, so that less debris is generated. Dual-laser ablation is more ionisation-dominated than single laser ablation, therefore a cleaner finish is obtained with double-focal-point ablation. In addition to the dual plumes and higher density of the ions present in the plumes, the kinetic energy of the ions is increased by a factor of six in dual-laser ablation process, according to Witanachchi's experiment. Higher kinetic energy leads to faster ejection of ions away from the machining spot, which in turn results in less deposition of debris.

4. Reduce chipping/cracking.

Chipping and cracking take place when a laser beam is used for ablation of brittle materials, such as semiconductor and some transparent materials. Chipping and cracking is caused mainly by shock waves generated during laser ablation due to thermal heating effect. Since double-focal-point ablation is more ionisation-dominated than melting-dominated compared with single-focal-point ablation, reduced chipping/cracking can be expected with double-focal-point ablation.

5. High aspect ratio can be obtained

As previously mentioned, double foci increase the focal depth of the machining laser spot. Therefore a higher aspect ratio of a machined channel or aperture can be obtained with double-focal-point ablation, for example, the machining of micro-vias in semiconductor wafers.

6. Reduced kerf width.

At the same system settings, kerf widths produced by double-focal-point ablation are found to be smaller than those produced by single-focal-point ablation. This has the advantage that a larger number of dies may be accommodated on a given semiconductor wafer, giving cost benefits.

7. Ability to cut any contours.

Unlike mechanical dicing tools, laser tools have the advantage of being able to dice any contours, and are not limited to straight line cuts.

8. Scanning

As discussed previously herein, laser machining using two focal points from a single laser source is known for machining thick metallic sheets in which two focal points are generated from a single laser source using a dual-focus lens. The dual-focus lens improves machining throughput and quality but is limited by a short lifetime and high cost of the lens. More importantly, particularly for silicon wafer processing, the main drawback of this technique is that the known dual focus lenses are not telecentric so that the laser beam cannot be scanned at high speed across a workpiece being machined using a galvanometer mirror but only at a relatively slow speed using a translation table, because during scanning a uniform beam focus would not be obtained across a square area of field of view of the lens. This imposes a serious throughput limitation on the known multi-focal technique for semiconductor wafer dicing. Moreover, the dual focus lens does not provide a micron-range separation between the two foci required for semiconductor wafer processing. Moreover, the invention has the cost advantage of using standard optical components without a necessity of manufacturing special optical components.

Therefore, in summary, this invention provides a technique of laser ablation using two foci generated from a single laser beam to improve ablation speed by generating more than one focus, of micrometer range separation, on, for example, a silicon wafer. The advantages of the invention include a high ablation rate and an ability to dice through thicker wafers than is readily achieved by a conventional laser ablation process. Additional advantages include: elimination of chipping, reduction of debris, reduction of kerf width, and an ability to dice any contour. This invention can be used as a direct replacement of conventional saw-dicing process, pre- and post-dicing processes remain unchanged.

The invention claimed is:

1. A laser machining apparatus comprising a plate polarising beam splitter for splitting an incident polarised laser beam to form a first laser beam and a second laser beam; optical beam modifying optics comprising an arcuate light reflecting device for providing the first laser beam with a different divergence or convergence from that of the second laser beam; focusing optics for focusing the first laser beam at a first focus on an optical axis of the focusing optics and for focusing the second laser beam at a second focus on the optical axis, such that the first focus and the second focus fall at different locations on the optical axis; and a galvanometer for scanning the first laser beam and the second laser beam across a workpiece to machine the workpiece.

2. A laser machining apparatus as claimed in claim 1, wherein the arcuate light reflecting device comprises a convex mirror.

3. A laser machining apparatus as claimed in claim 1, wherein a distance between the first focus and the second focus is selectable by selecting a radius of curvature of the arcuate light reflecting device.

4. A laser machining apparatus as claimed in claim 1, wherein a distance between the first focus and the second focus is between millimeters and tenths of microns.

5. A laser machining apparatus as claimed in claim 1, further comprising a laser beam generator for generating the incident polarised laser beam.

6. A laser machining apparatus as claimed in claim 1, wherein the plate polarising beam splitter comprises a polarisation dependent layer for substantially reflecting the first beam with a first polarisation component and substantially transmitting the second beam with a second polarisation component.

7. A laser machining apparatus as claimed in claim 1, wherein the incident polarised laser beam is substantially collimated.

8. A laser machining apparatus as claimed in claim 1, wherein the first laser beam is substantially collimated and the second laser beam is divergent after modification by the optical beam modifying optics.

9. A laser machining apparatus as claimed in claim 1, wherein the incident polarised laser beam is pulsed.

10. A laser machining apparatus as claimed in claim 1, wherein the laser machining apparatus further comprises a translation table for moving the workpiece with respect to the first laser beam and the second laser beam.

11. A laser machining apparatus as claimed in claim 1, wherein the first laser beam and the second laser beam interfere to form interference fringes and the apparatus further comprises imaging optics and an associated controller for using an image of the interference fringes to align the first and second foci on an optical axis of a scanning lens associated with the galvanometer.

12. A laser machining apparatus as claimed in claim 1, wherein the laser machining apparatus further comprises a scanning strategy controller for controlling at least one of incident laser beam power, incident laser beam pulse repetition rate, and galvanometer scanning speed during machining of a workpiece.

13. A laser machining apparatus as claimed in claim 1, further comprising a gas assist device for at least one of improving machining speed, improving removal of machining debris, and enhancing strength of the machined workpiece.

14. A laser machining apparatus as claimed in claim 1, further comprising a coating device for applying a protective sacrificial coating to a surface of the workpiece prior to laser machining for protecting the workpiece surface from debris produced during laser machining and facilitating removal of debris from the workpiece surface subsequent to laser machining.

15. A laser machining apparatus as claimed in claim 14, further comprising a coating removal device for removal of the protective sacrificial coating subsequent to laser machining.

16. A laser machining apparatus as claimed in claim 1, wherein the laser machining apparatus is arranged for dicing silicon wafers.

17. A laser machining apparatus, as claimed in claim 1, wherein an effective focal depth of the laser beam is increased.

18. A laser machining apparatus as claimed in claim 16, arranged to reduce a dicing kerf width thereby increasing a maximum numbers of dies per wafer.

19. A laser machining apparatus as claimed in claim 1, wherein the laser beam is characterized by an effective machining focal depth and an increased effective machining focal depth achieves increased aspect ratio micromachining of vias and increased throughput.

20. A laser machining apparatus as claimed in claim 1, arranged for scribing wafers to remove material.

21. A focusing apparatus for focusing an incident polarised optical beam, the apparatus comprising optical plate polarising beam splitter for splitting the incident optical beam to form a first optical beam and a second optical beam;
optical beam modifying optics comprising an arcuate light reflecting device for providing the second optical beam with a different divergence or convergence from that of the first optical beam; focusing optics for focusing the first optical beam at a first focus on an optical axis of the focusing optics and for focusing the second optical beam at a second focus on the optical axis, such that the first focus and the second focus fall at different locations on the optical axis, the first laser beam and the second laser beam interfering to form interference fringes; and,
imaging optics and an associated controller for using an image of the interference fringes to align the first focus and the second focus on the optical axis.

22. An apparatus as claimed in claim 21, wherein the first focus and the second focus are on a common optical axis of the focusing optics.

23. An apparatus as claimed in claim 21, wherein the arcuate light reflecting device comprises a convex mirror.

24. An apparatus as claimed in claim 1, wherein the plate polarising beam splitter comprises a polarisation dependent layer for substantially reflecting the first optical beam with a first polarisation component and substantially transmitting the second optical beam with a second polarisation component.

25. A method of laser machining a workpiece comprising the steps of:
a. splitting an incident polarised laser beam to form a first laser beam and a second laser beam using a plate polarising beam splitter;
b. modifying at least the second laser beam to provide the second laser beam with a different divergence or convergence from that of the first laser beam using an arcuate light reflecting device;
c. providing focusing optics;
d. using the focusing optics to focus the first laser beam at a first focus on an optical axis of the focusing optics and for focusing the second laser beam at a second focus on the optical axis, such that the first focus and the second focus fall at different locations on the optical axis; and
e. using a galvanometer to scan the first laser beam and the second laser beam across the workpiece to machine the workpiece.

26. A method as claimed in claim 25, comprising a further step of aligning the first and second foci on an optical axis of a scanning lens associated with the galvanometer using imaging optics and an associated controller for using an image of interference fringes formed by interference of the first laser beam and the second laser beam.

27. A method as claimed in claim 25, comprising a further step of controlling at least one of incident laser beam power, incident laser beam pulse repetition rate, and galvanometer scanning speed during machining of a workpiece.

28. A method as claimed in claim 25, wherein the arcuate light reflecting device comprises a convex mirror.

29. A method as claimed in claim 25, wherein the step of splitting the incident laser beam comprises using a polarisation dependent layer for substantially reflecting the first laser beam with a first polarisation component and substantially transmitting the second laser beam with a second polarisation component.

30. A method as claimed in claim 25, comprising a further step of using a translation table to move the workpiece with respect to the first laser beam and the second laser beam.

31. A method as claimed in claim 25, comprising a further step of providing a gas assist device for at least one of improving machining speed, improving removal of machining debris, and enhancing strength of the machined workpiece.

32. A method as claimed in claim 25, comprising a further step of applying a protective sacrificial coating to a surface of the workpiece prior to laser machining.

33. A method as claimed in claim 32, comprising a further step of removing the protective sacrificial coating subsequent to laser machining.

34. A method as claimed in claim 25, arranged for dicing silicon wafers.

35. A method as claimed in claim 25, wherein a distance between the first focus and the second focus is between millimeters and tenths of microns.

36. A method as claimed in claim 25, wherein a distance between the first focus and the second focus is selectable by selecting a radius of curvature of the arcuate light reflecting device.

37. A method as claimed in claim 25, wherein the laser beam is characterized by a focal depth that is sufficient for high aspect ratio micromachining.

38. A method as claimed in claim 34, wherein a dicing kerf is sufficiently reduced to increase a maximum number of dies per wafer.

39. A method as claimed in claim 25, arranged for high aspect ratio micro-via drilling in silicon wafers.

40. A method as claimed in claim 25, arranged for scribing wafers for removal of material from the wafer.

41. A method of focusing an incident polarised optical beam, comprising the steps of:

a. splitting the incident polarised optical beam to form a first optical beam and a second optical beam using a plate polarising beam splitter;

b. modifying at least the second optical beam for providing the second optical beam with a different divergence or convergence from that of the first optical beam using an arcuate light reflecting device;

c. providing focusing optics; and d. using the focusing optics to focus the first optical beam at a first focus on an optical axis of the focusing optics and to focus the second laser beam at a second focus on the optical axis such that the first focus and the second focus fall at different locations on the optical axis, the first laser beam and the second laser beam interfering to form interference fringes; and e. using imaging optics and an associated controller that use an image of the interference fringes to align the first focus and the second focus on the optical axis.

42. A method as claimed in claim 41, wherein the arcuate light reflecting device comprises a convex mirror.

43. A method as claimed in claim 41, wherein the step of splitting the incident optical beam comprises using a polarisation dependent layer for substantially transmitting the first optical beam with a first polarisation component and substantially reflecting the second optical beam with a second polarisation component.

* * * * *